United States Patent [19]
Nerem

[11] 4,150,413
[45] Apr. 17, 1979

[54] TRANSISTOR OVERLOAD INHIBIT

[75] Inventor: Arne Nerem, San Diego, Calif.

[73] Assignee: Rohr Industries, Inc., Chula Vista, Calif.

[21] Appl. No.: 848,472

[22] Filed: Nov. 4, 1977

[51] Int. Cl.² ............................................. H02H 3/26
[52] U.S. Cl. ........................................ 361/86; 361/92
[58] Field of Search ................... 361/86, 90, 91, 92; 363/50, 56; 330/207 P

[56] References Cited
U.S. PATENT DOCUMENTS

| | | | |
|---|---|---|---|
| T950,004 | 9/1976 | Tuttle | 361/56 X |
| 3,102,241 | 8/1963 | Johnstone | 330/207 P |
| 3,449,598 | 6/1969 | Wright | 361/91 |
| 3,764,883 | 10/1973 | Staad et al. | 361/86 X |
| 3,927,352 | 12/1975 | Schatz | 361/86 |

*Primary Examiner*—Harry E. Moose, Jr.
*Attorney, Agent, or Firm*—Patrick J. Schlesinger; Frank D. Gilliam

[57] ABSTRACT

An electronic circuit for inhibiting overconduction of power transistors utilized in a switching mode and driven by a square wave signal of selected frequency. A reference voltage is utilized to compare the conduction of the transistors. The signal produced as a result of the comparison is utilized to control the base drive to that transistor through a logic circuit. Timing means is provided to delay the turn on or tuen off of the drive signal responsive to the comparison signal.

5 Claims, 8 Drawing Figures

TRANSISTOR OVERLOAD INHIBIT

BACKGROUND OF THE INVENTION

The invention relates to protection circuits for transistors and, more specifically, to those transistors that are overconducting or are exposed to load faults in some manner that would result in their self-destruction.

In switching circuits, using power semi-conductors as current switching means, it is desirable to protect the active switching devices from overload conditions which may occur in operation, either due to component failures or excess demand imposed by the load.

Semi-conductor switching components have characteristics which are load dependent. The voltage drop or forward voltage of a semi-conductor switch is dependent upon the amount of current conducted through it. The forward voltage of transistors are drive related in such a fashion that for a given drive when the device's conduction capability is exceeded, the forward voltage increases rapidly as the transistor comes out of saturation. In thyristors, likewise, there is an increase in forward voltage in the presence of excessive conduction.

The on state losses are determined by the product of the forward voltage and the amount of current conducted through the semi-conductor switching component. It is advantageous to shut the device off whenever the on state losses become excessive so as to protect the switching device from over dissipation which is likely to cause overheating and subsequent degradation of device life or catastrophic failure.

SUMMARY OF THE INVENTION

The object of the instant invention is to provide means for detecting the forward voltage drop of thyristors or transistor switching devices and to compare such forward voltage to a pre-selected level of reference voltage during the on state or conducting state of the device. As long as the forward voltage of the device is below the acceptable voltage set by the referenced voltage, a voltage comparator will provide a high or one signal level at its output. When the forward voltage level of the device is greater than the acceptable level selected by the referenced voltage, the comparator will present an output of zero or low.

The output of the the comparators during the on conducting state of the switching device will either be a high one or a low zero depending upon its forward voltage during the undriven state; however, the signal is only of interest during the driven state and may be ignored while in off state.

In each case, the output signal from the comparators will be monitored by logic circuits and will cause the drive to be inhibited for sufficient time for the device to recover whenever a fault condition is detected.

Other objects, advantages and novel features of the present invention will become apparent from the following detailed description of the invention when considered in conjunction with the accompanying drawings.

DESCRIPTION OF THE PREFERRED EMBODIMENT

Figure 1:
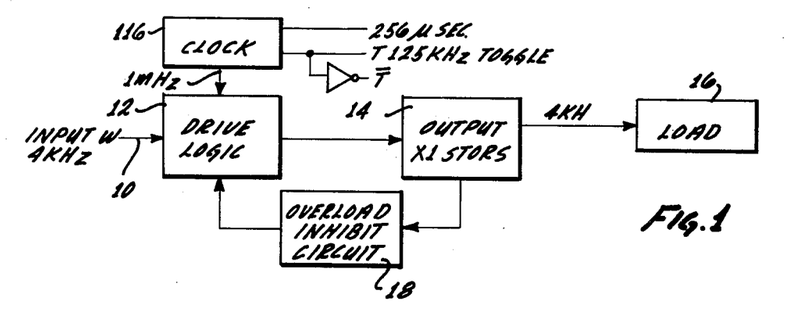
FIG. 1 shows block diagram incorporating the device of the instant invention.

Referring now to FIG. 1, input signal 10 shown to be 4 KHz for explanation only. Any frequency square wave signal within circuit limitations could be used to practice the invention. This signal is fed into a drive logic 12, hereinafter explained. The output from drive logic 12 supplies a signal to the output transistor circuit 14. The output of the output transistor circuit 14 drives the load 16. A feedback circuit 18 is provided which is hereinafter referred to as the overload circuit. The overload circuit 18 detects the conduction of the output transistors, hereinafter explained. The output of the overload circuit 18 is fed back to control the aforementioned drive logic circuit 12.

Figure 2:
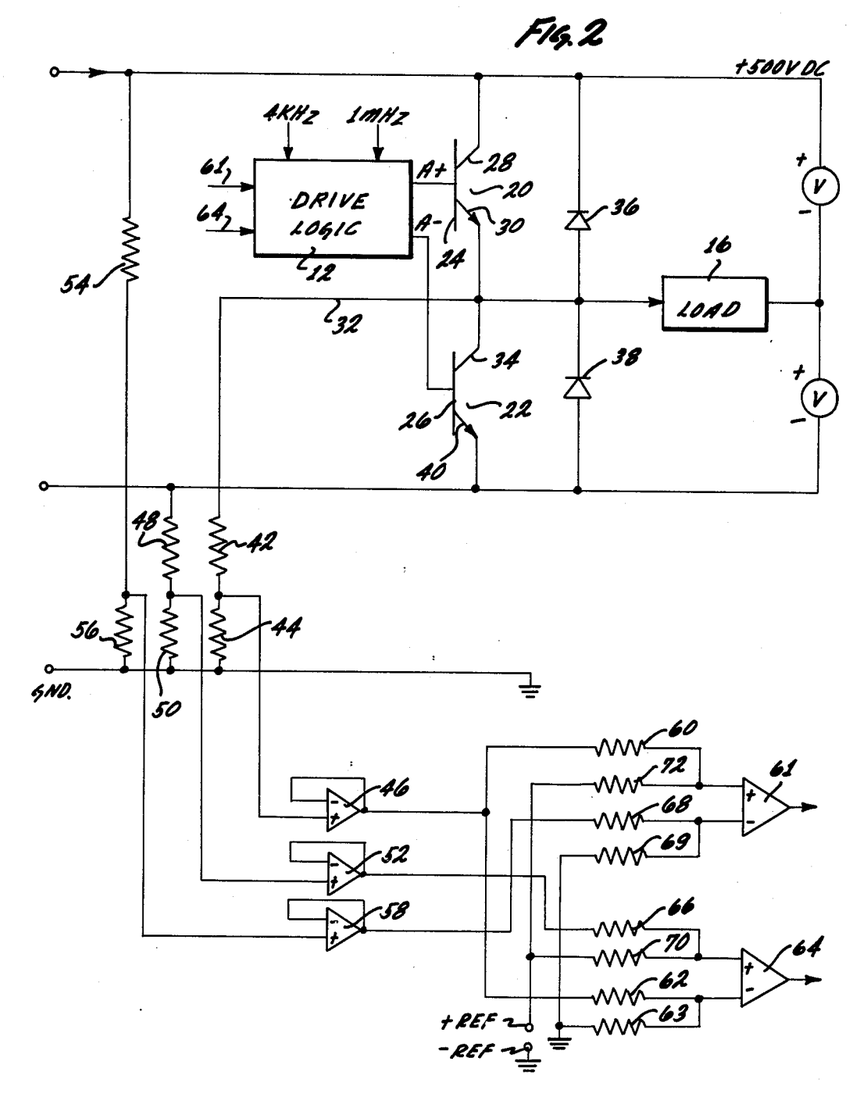
FIG. 2 shows a schematic of the circuit of the instant invention for full wave single phase output.

Referring now to FIG. 2, this is a schematic diagram of the overload circuit 18. Output transistors 20 and 22 are shown. The base elements 24, 26 of these transistors are connected to the output of the drive logic circuit 12. The collector 28 of transistor 20 is connected to a source of DC voltage. The example utilizes 500 volts DC, however any suitable level may be utilized depending on the operating voltage of the devices 20, 22. The emitter element 30 of transistor 20 is connected to line 32, which is a return path from the 500 volts supplied to the load. Transistor 22 has its collector element 34 connected to the line 32 from the load. Across the emitter and collector elements 30, 28 of transistor 20, is the diode 36 having its anode connected to the emitter element of transistor 20 and its cathode connected to collector element of transistor 20. Diode 38 is connected to the collector 34 and emitter 40 of transistor 22 with the anode connected to the emitter element and the cathode connected to the collector element as explained with regard to the diode 36. The anode of diode 38 and the emitter 40 of transistor 22 are connected to the negative side of the 500 volt power supply.

The common line 32 from the emitter element 30 of transistor 20 and the collector element 34 of transistor 22 are tied through an attenuating resistor 42 through a second attentuator resistor 44 to the common system ground potential. The value of these resistors are determined by the value of the voltage level at the common point between the emitter and collector and the maximum input voltage level of line follower 46. A common point between the resistor 42 and 44 is connected to the positive input of a source follower 46. The negative input to the source follower 46 is connected to its own output. The negative power potential of the power supply is connected to diode 38 and the emitter element transistor of transistor 22 this common point is tied through attenuator resistors 48 and 50 to ground potential. The center connection between resistors 48 and 50 is tied to the positive input of a source follower 52. It, like source follower 46, has its negative input tied to its own output. The 500 volt source, which is common to the collector element 28 of transistor 20 and the cathode element of diode 36, is tied through an attenuator resistor 54 of 99,000 ohms to resistor 56 of 1K ohms to ground potential. The common connection between attenuator resistor 54 and 56 is tied to the positive input of a source follower 58. The negative input of this source follower 58 is tied to its own output like source followers 46, 52.

The output from source follower 46 follows two parallel paths. One path is through resistor 60 of 10,000 ohms connected to the positive input of a comparator 61. The other connection from the output of source follower 46 provides an input through resistor 62 of 10,000 ohms to the negative input of a comparator 64. The output from a source follower 52 provides an input through resistor 66 of 10,000 ohms to the positive input of a comparator 64. The output from a source follower 58 provides an input through resistor 68 of 10,000 ohms to the negative input of the comparator 61. Resistor 69 from the negative input to the comparator 61 and resistor 63 from the negative input to the comparator 64 are tied to ground potential. A reference voltage of 0.05 volts DC is tied through resistor 70 of 10,000 ohms to the positive input of the comparator 64 and through resistor 72 of 10,000 ohms to the positive input of the comparator 61. The outputs of the comparators 61 and 64 provide inputs to drive logic circuit 12 hereinafter explained. The load 16 in this showing is connected to the common point of balanced split power supplies well known in this art.

Figure 3:
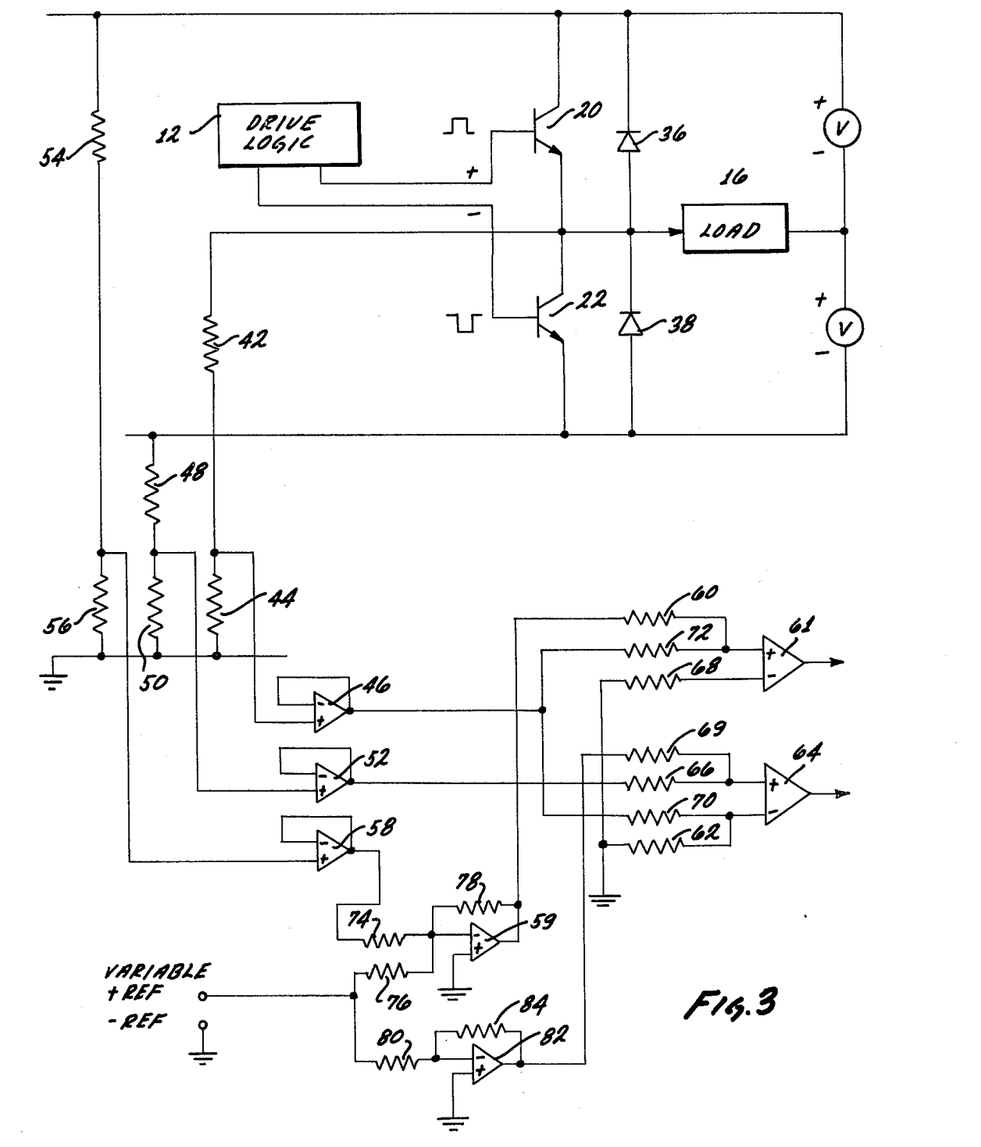
FIG. 3 shows a circuit similar to FIG. 2 except for a different way of maintaining reference voltage.

Referring now to FIG. 3, this schematic represents a similar device as heretofore explained in FIG. 2 with some minor exceptions. The same 500 volt power supply is present and the same diodes 36, 38, and transistors 20 and 22 are present. The same attenuator resistors are shown. The same source followers 46, 59 and 58 are shown. The difference in this schematic is the output of the source followers 46, 52 and 58. The output of source follower 46 provides an input through resistor 72 to the positive input of the comparator 61 and through resistor 70 to the negative input of the comparator 64. The output of the source follower 52 provides an input through resistor 66 to the positive input of comparator 64. The output of the source follower 58 provides an input to the negative input of the operational amplifier 59 through resistor 74. Another supply to the negative input of operational amplifier 59 is provided through resistor 76 from the reference voltage source. The positive input to the operational amplifier 59 is tied to ground potential. Between the output and negative input of operational amplifier 59 is a resistor 78. The output of the operational amplifier 59 provides an input through resistor 60 to the positive input of the comparator 61. The reference voltage is also tied through resistor 80 to the negative input of the operational amplifier 82. The negative input of the operational amplifier 82 is tied through resistor 84 to its own output as hereinbefore described in the explanation of the operational amplifier 59. The positive input of the operational amplifier 82 is, likewise, tied to ground potential. The output of the operational amplifier 82 is tied through the resistor 69 to the positive input of the comparator 64. The negative input of the comparators 61 and 64 are tied to ground through resistors 68 and 62, respectively. The outputs of the comparators 61 and 64 provide the inputs to drive logic 12 as hereinbefore described in FIG. 2.

Figure 4:
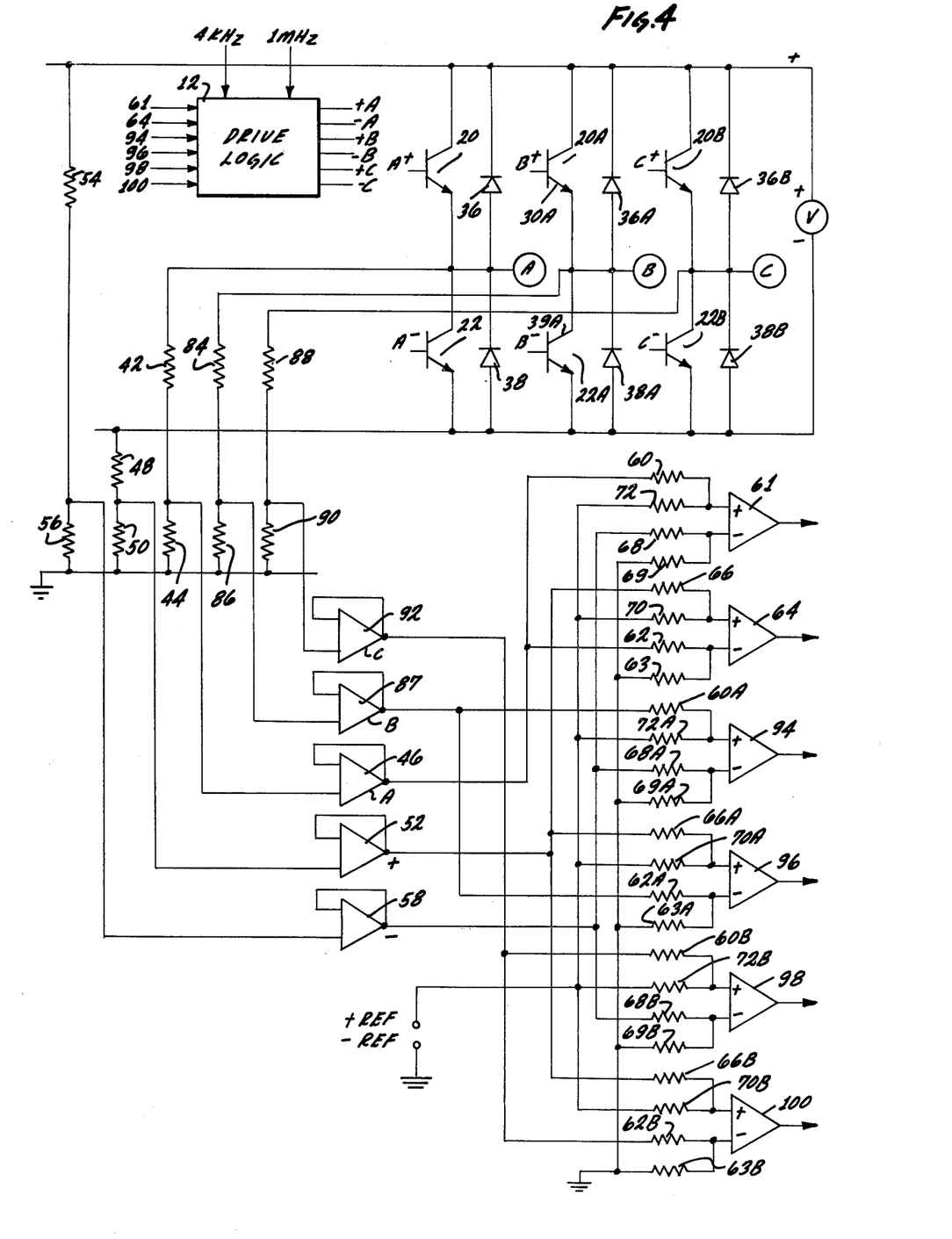
FIG. 4 shows a schematic circuit of the instant invention as applied to a three phase system.

Referring now to FIG. 4, this shows a three phase embodiment of the overload circuit 18. A power supply of 500 volts DC plus and minus is shown. In addition to the pair of transistors 20 and 22 and their associated diodes 36 and 38, we have two other pairs of transistors 20A, 22A and their associated diodes 36A and 38A, and 20B and 22B and their associated diodes 36B and 38B. The transistors 20 and 22 representing phase A, and 20A and 22A representing phase B, and 20B and 22B representing phase C.

The B phase transistors have emitter 30A of transistor 20A and the collector 39A of transistor 22A connected through attenuating resistor 84 and 86 to ground with an input between the attenuator resistors to the B phase source follower 87. Likewise, C phase has attenuator resistors 88 and 90 with their connection tied to the input of the source follower 92 for phase C. Resistors 84, 86 and 88, 90 will have substantially the same value as resistors 42, 44 respectively. Additional comparators 94 and 96 monitor the conduction voltage for transistors 20A and 22A, respectively, and comparators 98 and 100 provide an output signal responsive to the conduction voltage of transistors 20B and 22B, respectively. The reference voltage provides inputs as referred to in FIG. 2 of 0.05 volts DC. The output of these comparators 94, 96, 98 and 100 provide inputs to drive logic 12 as hereinbefore explained. The phase A transistors are connected to the various components as hereinbefore explained. The drive logic 12 supplying signals to this embodiment is required to have negative and positive going pulses for each phase. The loads not shown are connected in delta or "Y" fashion well known in the three phase power art.

Figure 5:
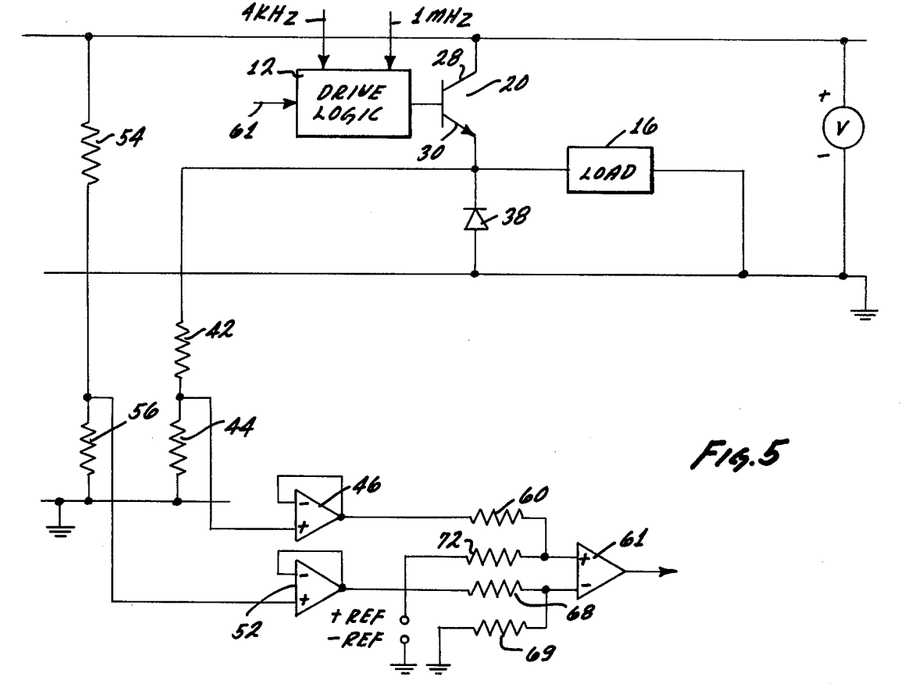
FIG. 5 shows a one embodiment of a single transistor single phase half wave system.

Referring now to FIG. 5, this rendition is of a single half wave of phase A. Likewise, a 500 volt source is shown, with the high side connected to the collector element 28 of transistor 20 while the emitter element 30 of transistor 20 is connected to the load and to the cathode element of diode 38, whose anode element is tied to the negative 500 volt potential. The common point between the emitter element 30 of the transistor 20 and the cathode element of diode 38 is tied through attenuator resistors 42 and 44 as hereinafter explained, with resistor 44 being tied to ground potential and the common point between resistors 42 and 44 being tied to the positive input of source follower 46 in the same manner as hereinbefore described. Likewise, attenuator resistor 54 is tied to the 500 volt positive potential which goes to ground through a second attenuator resistor 56. The common connection between resistors 54 and 56 is tied to the positive input of line follower 52, as hereinbefore described. The outputs of line followers 46 and 52 provide inputs respectively to the positive and negative inputs of the comparator 61 through resistors 60, 68, respectively. Resistor 72 ties the positive input to comparator 61 to the positive reference voltage. A resistor 69 is connected from the negative input of comparator to the ground potential. The output of comparator 61 is tied to the drive logic circuit 12 hereinafter described.

Figure 6:
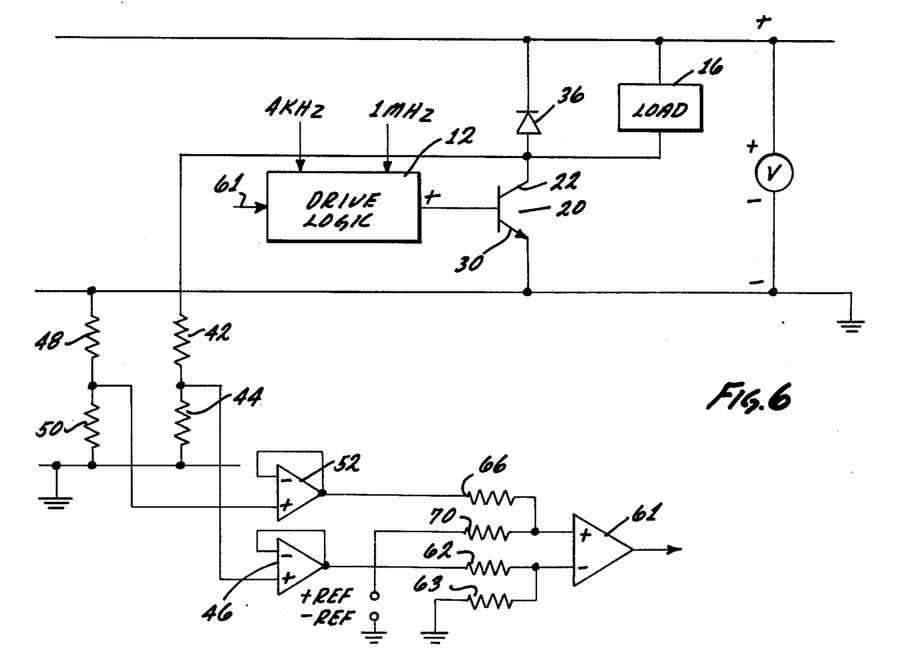
FIG. 6 shows a second embodiment of a single phase half wave system.

Referring now to FIG. 6, a second embodiment of the device of FIG. 5 is shown. In this embodiment the positive 500 volt DC is tied to one side of the load and to the cathode of diode 36. The other side of the load is connected to the anode of diode 36 and the collector element 32 of transistor 20 which is connected through attenuator resistor 42 and resistor 44 through to ground potential. The common connection between resistors 42 and 44 being tied to the positive input of the source follower 46. The negative 500 volts is tied to the emitter element 30 of transistor 20. The common connection between attenuator resistor 48 and 50 connected from negative 500 volts to ground is tied to the positive input of the source follower 52. Both source followers 52 and 46 have their negative inputs tied to their outputs as hereinbefore described. The outputs of line followers 52 and 46, respectively, supply inputs to positive and negative terminals to comparator 61 through resistors 66 and 62. The negative input to comparator 61 is tied through resistor 63 to ground potential, while the positive input of comparator 61 is tied through resistor 70 to the reference voltage. The output of comparator 61, like the previously described figures, supplies an input to drive logic 12, which is hereinafter described.

Figure 7:
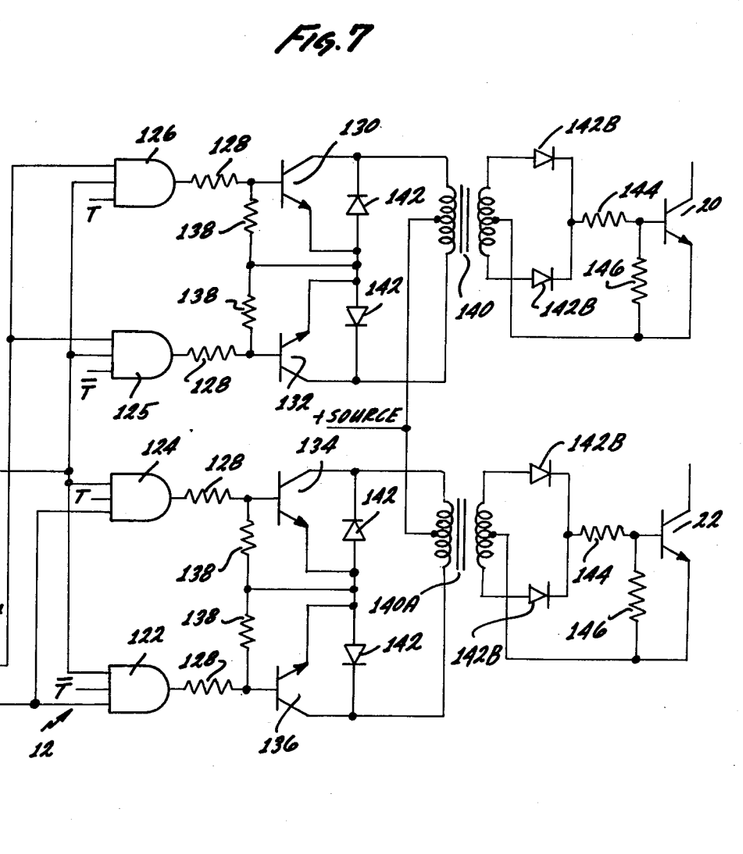
FIG. 7 shows a schematic diagram of the drive logic circuit.

Referring now to FIG. 7, the output from comparators 61 and 64 of FIG. 3 provide inputs to the negative and positive AND gates 108 and 110, respectively, of this circuit. The input square wave signal, the one to be controlled by the circuit, is shown to have a frequency of 4 KHz. Any other square wave signal frequency could be utilized to practice the invention. The 4 KHz input signal is fed into the D input of a D flip-flop 106 of the type SN7474 manufactured by Texas Instruments Company or any electrical equivalent thereto. The Q output from the D flip-flop 106 is fed into one input of AND gate 108 and the $\overline{Q}$ output from the same D flip-flop is fed into one input of AND gate 110. The output of AND gates 108 and 110 supply the inputs to OR gate 112. The output from OR gate 112 supplies a reset input to shift counter 114 of the type RCA CD4017 or any electrical equivalent thereto. Shift counter 114 is provided an input of one megahertz from clock 116, see FIG. 8. A seven microsecond delay output pulse from shift counter 114 supplies a clear input to a second D flip-flop 118 of the type SN7474 or any electrical equivalent thereto through inverting gate 119. The Q output of D flip-flop 118 provides parallel inputs to the reset input R of a second counter 120, one input to a three input AND gate 122, one input to a three input AND gate 124, one input to a three input AND gate 125 and one input to a three input AND gate 126. The second counter 120 is continuously clocked by a 256 microsecond period clock from clock 116 of FIG. 8. The four millisecond output terminal of the second counter 120 provides the C (clock) input to the second D flip-flop 118.

Referring now back to the first D flip-flop 106, the $\overline{Q}$ output, in addition to supplying an input to three input AND gate 110, hereinbefore described, provides one input to AND gate 122 and AND gate 124. Likewise, the Q output of D flip-flip 106, in addition to supplying an input to three input AND gate 108, hereinbefore described, provides one input to AND gate 126 and AND gate 125. Each of the AND gates gets a 125 KHz toggle input from the clock 118 (see FIG. 1). AND gates 124 and 126 receive positive toggles and AND gates 122 and 125 receive inverted toggles. The outputs from each of the AND gates are fed through series resistors 128 to the base element of their appropriate driver transistors 130-136. Each pair of these driver transistors have their emitters tied together and at the common connection between the emitters, each has a diode with the anode element connected to the transistor emitter element and the cathode element connected to the transistor collector element. Each transistor also has a second resistor 138 connected between the series resistors 128 and the base elements to the common connection between the emitter elements. The collector elements of each of these pairs of transistors connects to each end of the primary of transformer 140, 140A. The center taps of the transformer 140, 140A being tied together and connected to a 5 to 50 volt source, the source value depending on the requirements of the driver transistor choosen. The transformers 140, 140A will either have a one to one ratio or step down ratio between primary and secondary windings, the step down ratio to reduce the 5 to 50 volt primary input to a 5 volt secondary output. The secondary of each transformer is fed through diodes 142B at each end to a common connection. These diodes 142B have their anodes connected directly to the transformer secondary and their cathodes connected to 5 ohm series resistor 144, the resistor 144 being in series with the base of transistors, respectively, of the full wave system as shown in FIG. 7. The tap from the secondary of the transformers are tied through a resistor 146 between the base and emitter elements of the last mentioned transistors. The ratio between these two resistors 144 and 146 will be about 1 to 2, that is, a 5 ohm in series with the base, and a 10 ohm to the secondary. The secondary of the transformer is further tied to the emitter of their respective transistors 20, 22.

Figure 8:
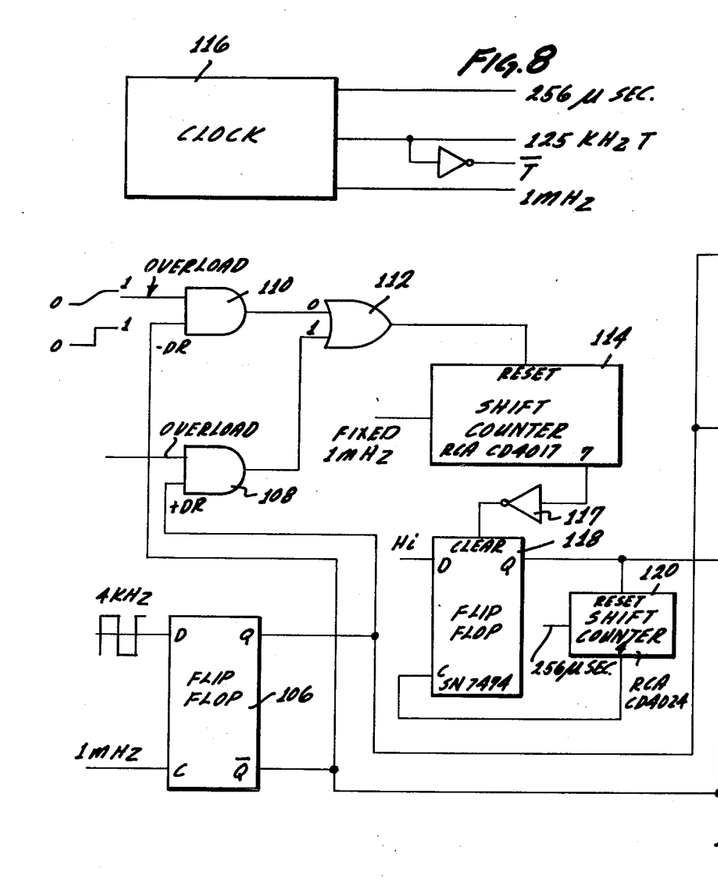
FIG. 8 shows a block diagram of a clock utilized for providing timing for the instant invention.

Referring now to FIG. 8, block diagram of a standard electronic clock well known in the industry that provides the various output frequencies as required by the circuits hereinbefore mentioned.

As hereinbefore described, the square wave signal with which to operate the output transistors 20, 22 is chosen at 4 KHz. The input to the D flip-flop 106 is this 4 KHz input at a very low power level.

In each case, the output signals from the various comparators of FIGS. 2 through 7 is an amplified version of the input square wave signal.

OPERATION OF THE PREFERRED EMBODIMENT

Referring now to FIG. 2, when transistor 20 is in its on state, the voltage on its collector element 28 which is the plus DC voltage is presented to the input of the source follower 58 through the attenuators comprised of resistors 54 and 56. The voltage at the emitter terminal of transistor 20 is presented to the input of the source follower 46 through the attenuator comprised of resistors 42 and 44. The attenuation ratio between these resistors is selected such that the input to the source followers are aproximately 5 volts with respect to ground for a maximum DC voltage (such as 500v), with respect to the minus DC voltage of operation. The source followers have a very high input impedances and zero gain so as to present the input signals to output terminals without loading the attenuators. Similarly, the plus DC value and the minus DC value is derived at the output of source followers 46 and 58, respectively. The voltage at the output terminal of source follower 46 is presented through resistor 60 to the input of comparator 61. The positive reference voltage is connected through resistor 72 to the positive input of comparator 61. The output of source follower 58 through resistor 68 to the negative input of comparator 61, which has the resistor 69 connected to ground. Resistors 60, 62, 68, 69 and 72 are equal in value and are typically 10,000 ohms.

As can be observed from the diagrams, the voltage at the negative terminal would be approximately plus 2.5 volts or half the 5 volts as presented at the common connection of attenuator resistors 54 and 56. If, for example, for an attenuator ratio of 100 to 1, the 500 volt DC supply would present 5 volts DC at the output of line follower 58. If 5 volts DC is dropped across the transistors for maximum conduction, the voltage at the emitter element of transistor 20 would be 495 volts DC. Therefore, 4.95 volts DC would appear at the output of line follower 46. With the positive reference set at 0.05 volts DC corresponding to the 5 volt drop across the transistor, the voltage at the positive input of the comparators would equal 2.5 volts DC. Therefore, equal to the voltage at its negative terminal. The comparator 61 will, if the voltage at the emitter 30 of transistor 20 falls below 495 volts DC, therefore, be lower than 2.5 volts DC on the plus terminal, thereby producing the low or zero on its output terminal. This means that for a drop greater than 5 volts across transistor 20 will result in an output 0 or low, a drop less than 5 volts across the transistor will produce an output of a one or high at the output of comparator 61.

Similarly, comparator 64 has an input of a minus DC voltage to its plus input terminal which has been scaled down by 1/100th of its value by attenuator resistors 48 and 50. Because the negative DC voltage is dependent on the system ground configuration, it may equal 0 or low, or ½ of the plus DC value. Attenuator resistors 48 and 50 provide for the cancellation of this common mode voltage. Consider minus DC volts is equal to 0. As can be seen, this will produce a voltage at the positive input of the comparators equal to 0.025 volts. If the transistor 22 has a 5 volt drop in the on state condition, this will result in an output from attenuators resistors 42 and 44 of 0.05 volts which, in turn, presents 0.025 volts on the negative terminal of comparator 64. If the drop across transistor 22 increases, the voltage at the negative terminal of comparator 64 increases and comparator 64 will present a 0 or low state at its output. If the voltage across transistor 22 decreases, the voltage of the negative terminal of comparator 64 decreases and a 1 or high level results at its output terminal.

Thus, we have established that some reference voltage is used to detect the forward voltage drop of transistors 20 and 22. For voltages other that the 5 volts selected for the example, an appropriate adjustment is made in the level of reference voltage.

As previously discussed, the effect of attenuators 48, 50 is to accommodate common mode voltages in power systems or floating power supply configurations. As can be seen, if the minus DC voltage changes, a scale change is added to resistor 66 by the attenuator circuit. This has the effect of subtracting the emitter element voltage from the collector voltage of transistor 22 before comparing it to the reference, similarly, to the method described for transistor 20.

The load configuration shown in FIG. 2 may be to a split supply in other switching circuits similar to transistor 20 and 22 in a multifaced system. In such multifaced systems, additional attenuators source followers and voltage comparators are added with appropriate number of phase outputs. The remaining plus and minus attenuators and source followers may be common to these circuits. The circuit in FIG. 3 uses the identical approach to drive the reference voltage for the comparators in a different fashion. There, each of the comparators is referenced to ground through resistors 68 and 62 and a direct comparison is made by comparator 64 for transistor 22 using a negative 0.05 DC reference. The comparator for transistor 20 is referenced to the negative 4.95 volt obtained by subtracting a positive 0.05 volts from the positive 5 volts from the DC attenuators in inverting amplifier 59 and, thus, obtaining the negative 4.95 volts for comparator 61. The comparator for transistor 22 is referenced to the negative 0.05 reference at the output of inverting amplifier 82.

FIG. 4 illustrates the three phase bridge inverter using the method of operation as described in reference to FIG. 2.

FIG. 5 shows a half wave circuit such as is common in the DC to DC converters. The same method of operation is used as described in FIG. 2.

FIG. 6 shows a separate embodiment of a half wave circuit such as is common in DC to DC converters and used the same method of operation as described in the discussion in FIG. 2.

Referring now to the drive logic 12 of FIG. 7. Take, for example, the overload voltage signal output from comparator 64 which represents the positive output for the positive drop across transistor 20 providing a one input to AND gate 108 and, at the same time, the four kilohertz input to D flip-flop 106. This is a high state, the Q output of the D flip-flop 106 provides a second high or a one input to AND gate 108. Therefore, the output of AND gate 108 now presents a one which is supplied to one input of OR gate 112. AND gate 110 has at least one zero input from $\overline{Q}$ of flip-flop 106 and will have a 0 or low output which provides a 0 to the second input of OR gate 112. Therefore, the output of OR gate 112 is high, providing a one to the reset input of shift counter 114, which continually resets the shift counter, preventing the count from reaching the 7 microsecond delay counter output, therefore, the input to the clear terminal of the second flip-flop 118 is 1 because of the inverting gate and, therefore, with a high input at the D input, the output at Q is a high or one. Note that an 0 at the clear input of flip-flop 118 is required to clear same. The second shift counter 120 has a one on its reset, therefore, the four millisecond output is at a low or 0 and the D flip-flop 118 is not clocked. The one or high from the Q output of the D flip-flop 118 further provides a one or high input to AND gates 125 and 126. The second input to AND gates 125 and 126 was also high because of the high output present at the Q output of D flip-flop 106, the toggle and inverted toggle rate of 125 kilohertz, therefore, provided at the third input to AND gates 126 and 125 respectively results in outputs from AND gates 126 and 125 of same toggle and inverted toggle respectively. These outputs from AND gates 125 and 126 therefore provide a convenient means of transforming the drive signal across transformers 140, 140A to rectifiers 142B to control the base drive to transistor 20. It should be understood that the operation of transistor 22 is in the same manner as described for transistor 20. That is, when the input signal to D flip-flop 106 goes negative on the 4 kilohertz cycle, then the $\overline{Q}$ output will become 0 and the Q output will become one, causing AND gate 110 to now have a one output when its other input is one, and supply a one input to OR gate 112, wherein AND gate 108 now has a 0 output and provides a 0 input to OR gate 112 which provides a one or high output.

If, for example, a malfunction should exist in the transistor output of 20 and 22, that is when the positive transistor 20 should be conducting and the conduction is such that the output of comparator 61 be 0 rather than a 1, then two 0's will be present at the input of OR gate 112, providing a 0 at reset output to shift register 114. This lack of a reset high or one input from OR gate 112 causes the shift register counter 114 to count to the 7 microsecond count, then provide a clear from the 7 microsecond output to second D flip-flop 118 through inverting gate 117, switching the Q to a 0 or low output which, in turn, lets the second counter 120 count to its 4 millisecond count, further provides 0 to AND gates 122, 124, 125 and 126, thus, terminating the base drive to transistors 20 and 22. After these transistors have been turned off for the 4 milliseconds required for the second counter 120 to provide a one or high clock pulse to second D flip-flop 118, the D flip-flop 118 is then clocked to a one or high at its output of Q, however, if the 7 microsecond pulse output provides a high or a 1 (0 after inverting gate) again, to the clear input of second D flip-flop 118, the one or high present on the Q from the reset pulse will again become a 0 or low, the AND gates 122, 124, 125 and 126 will again have no high output, the transistors will remain cutoff, the counter will again provide a 4 millisecond reset count to the C (clock) input of the second D flip-flop. This time, if transistors 20 and 22 are back to normal, there will be no output from the 7 microsecond output of first counter 114, therefore, the clear will not be reset, the Q will have its normal 1 or high output and the appropriate base drive will be supplied to its transistor.

Although the invention has been described relative to the exemplary embodiments thereof, it will be understood by those skilled in the art, that variations and modifications may be effected in the embodiments without departing from the scope and spirit of this ivention.

What is claimed is:

1. An electronic circuit for inhibiting over-conduction of a power transistor utilized in a power switching circuit, said transistor having a base, collector and emitter element, said base element being driven by a square wave drive signal of selected frequency, said circuit comprising:
    a reference voltage having a positive and negative connection;
    first means for comparing the voltage level on the emitter and collector elements of said transistors with said reference voltage and producing a control signal responsive thereto, said first means comprises a first source follower connected to the emitter element of said transistor, a second source follower means connected to the collector element of said transistor and a comparator means having one input from the output of said first follower means and the positive connection of said reference voltage and a second separate input from said second source follower and the negative connection of said reference voltage; and
    second means positioned intermediate the base element of said transistor and said square wave drive signal, the output of said second means controlled by said control signal.

2. An electronic circuit for inhibiting over-conduction of power transistors utilized in power switching circuits, said transistors each having a base, collector and emitter element, each of said base elements being driven by a square wave drive signal of selected frequency, said circuit comprising:
    a reference voltage having a positive and negative connection;
    a first means for comparing the voltage levels on each of said transistor emitter and collector elements with said reference voltage and producing control signals responsive thereto; and
    a second means positioned intermediate the base of each transistor and its input square wave drive signal, each output of said second means controlled by its respective control signal; said first means comprises, at least one first and second transistors, said emitter element of one first transistor and said collector element of one second transistor being connected to a common point, the collector element of at least one first transistor being connected to a first source follower, said emitter of at least one second transistor being connected to a second source follower, each common point being connected to a separate third source follower, each first and second transistor having respective first and second comparator means, said first comparator means having a first input from its respective third source follower and said reference voltage positive connection and a second input from said first source follower and said reference voltage negative connection, said second comparator having a first input from said second source follower and said reference voltage negative connection and a second input from its respective third source follower and said reference voltage positive connection, the output of said comparator connected to said second means for controlling the drive to their respective transistors.

3. An electronic circuit for inhibiting over-conduction of power transistors utilized in power switching circuits, said transistors each having a base, collector and emitter element, each of said base elements being driven by a square wave drive signal of selected frequency, said circuit comprising:
    a reference voltage having a positive and negative connection;
    a first means for comparing the voltage levels on each of said transistor emitter and collector elements with said reference voltage and producing control signals responsive thereto, said first means comprises at least one first and second transistor, said emitter element of one first transistor and said collector element of one second transistor being connected to a common point, the collector element of at least one first transistor being connected to a first source follower, said emitter of at least one second transistor being connected to a second source follower, each common point being connected to a separate third source follower, each first and second transistor having respective first and second comparator means, the output of said third source follower provides a first input to a first connection of a first and second operational amlifier, the positive connection of said reference voltage provides a second input to said first connections, the second connection of said operational amplifiers being connected to the reference voltage negative connection, said first comparator means having a first input from said first operational amplifier and the output of said first line follower and a second input from said reference voltage negative connection, said second comparator having a first input from the output of said second operational amplifier and the output of said second line follower and a second input from said reference voltage negative connection; and
    a second means positioned intermediate the base of each transistor and its input square wave drive signal, each output of said second means controlled by its repsective control signal.

4. An electronic circuit for inhibiting over-conduction of a power transistor utilized in a power switching circuit, said transistor having a base, collector and emitter element, said base element being driven by a square wave drive signal of selected frequency, said circuit comprising:
   a reference voltage having a positive and negative connection;
   first means for comparing the voltage level on the emmiter and collector elements of said transistors with said reference voltage and producing a control signal responsive thereto; and
   second means positioned intermediate the base element of said transistor and said square wave drive signal, the output of said second means controlled by said control signal, said second means comprises a timing means and logic means, said logic means resonsive to said timing means and said control signal for delaying the turning off and turning on of said square wave drive signal in response to said control signal.

5. The invention as defined in claim 2, wherein said second means comprises a timing means and a plurality of logic means, one of said logic for each first and second transistor, each logic means responsive to said timing means and their respective transistor control signal.

* * * * *